United States Patent [19]
Kambara

[11] Patent Number: 6,019,932
[45] Date of Patent: Feb. 1, 2000

[54] METHOD OF SEALING ELECTRONIC PARTS WITH A RESIN

[75] Inventor: Kenji Kambara, Otsu, Japan

[73] Assignee: Toray Engineering Co., Ltd., Osaka, Japan

[21] Appl. No.: 09/116,931

[22] Filed: Jul. 17, 1998

[30] Foreign Application Priority Data

Jul. 18, 1997 [JP] Japan ................................. 9-210138

[51] Int. Cl.$^7$ ............................ B29C 70/78; B29C 70/80
[52] U.S. Cl. ...................... 264/510; 264/272.11; 264/102
[58] Field of Search ................................... 264/510, 101, 264/102, 251, 254, 272.11, 272.17; 425/116, 546, 120

[56] References Cited

U.S. PATENT DOCUMENTS

| | | | |
|---|---|---|---|
| 3,322,871 | 5/1967 | Noack et al. | 264/272.17 |
| 3,384,931 | 5/1968 | Cochran et al. | 264/272.17 |
| 4,216,577 | 8/1980 | Badet et al. | 264/272.17 |
| 4,480,975 | 11/1984 | Plummer et al. | 425/116 |
| 5,843,359 | 12/1998 | Kudo et al. | 264/263 |
| 5,879,598 | 3/1999 | McGrane | 264/102 |

FOREIGN PATENT DOCUMENTS 4-346235  12/1992  Japan .
6-66350   8/1994   Japan .

*Primary Examiner*—Angela Ortiz
*Attorney, Agent, or Firm*—Burns, Doane, Swecker & Mathis, L.L.P.

[57] ABSTRACT

A method of sealing electronic parts mounted on the substrates with a resin, by porous plate-printing, by employing a primary porous plate-printing in which sealing portions of an electronic part mounted on a substrate are filled with a sealing resin through resin push-in pores formed in the porous plate in vacuum by reciprocally moving a squeeze, the resin is introduced based on a pressure difference in vacuum of a degree lower than that of the above vacuum state so that the sealing resin infiltrates into every gap under the wires bonding the lead wires of the substrate to the electronic part, and supplementary sealing with the resin is effected by a secondary porous plate-printing. Even those portions in the structure of the electronic part that cannot be easily filled with the sealing resin can be filled with the sealing resin without forming air-containing voids. Besides, such portions can be filled without causing damage to the wires. The sealing with the resin is effected maintaining flat surfaces of the sealing resin, highly precise shape and size of the resin-sealed structure, and offering highly improved reliability for the resin-sealed electronic parts.

2 Claims, 3 Drawing Sheets

METHOD OF SEALING ELECTRONIC PARTS WITH A RESIN

BACKGROUND OF THE INVENTION

1. Field of the Invention

The present invention relates to a method of sealing electronic parts with a resin.

2. Description of the Related Art

In the field of packages for microelectronics, so far, it has been widely accepted practice to seal electronic parts [CSP (Chip Scale Package), COB (Chip On Board), PLCC (Plastic Leadless Chip Carrier), BGA (Ball Grid Array), TAB (Tape Automated Bonding), etc.] with a resin. A representative example has been disclosed in, for example, Japanese Unexamined Patent Publication (Kokai) No. 4-346235 according to which a sealing resin is porous plate-printed (screen-printed) generally in an open atmosphere.

In recent years, however, the content of a filler component in the resin has been increased from the standpoint of improving reliability of the sealing. Besides, due to its thixotropic property, the resin exhibits further increased viscosity. It is, therefore, becoming difficult to introduce the resin by smoothly passing it through very small gaps between densely bonded wires without causing damage to the wires.

Accordingly, the lower portions of the wires (e.g., portions A1, A2 in FIG. 1) that are densely bonded are not filled with the sealing resin but air remains to form voids. Or, due to the voids and local settlement of the resin, the sealing resin is not flat on the surface or lacks dimensional precision.

Therefore, it has been proposed to effect porous plate-printing in vacuum as disclosed in, for example, Japanese Examined Patent Publication (Kokoku) No. 6-66350. Even though porous plate-printing is effected in vacuum, however, it is not possible to eliminate the above-mentioned defects, such as the difficulty in introducing the resin by smoothly passing it through very small gaps among the densely bonded wires without causing damage to the wires.

SUMMARY OF THE INVENTION

The object of the present invention is to provide a method of sealing electronic parts mounted on substrates, with a resin based on a porous plate-printing method, while eliminating the above-mentioned defects.

In order to eliminate the above-mentioned defects, the present invention is based on the idea that an electronic part mounted on a substrate is sealed with a resin based on a first porous plate-printing (hereinafter referred to as primary porous plate-printing) in a vacuum, the resin is introduced based on a pressure difference, and supplementary sealing is effected based on a second porous plate-printing (hereinafter referred to as secondary porous plate-printing).

That is, the present invention is concerned with a method of sealing electronic parts mounted on substrates with a resin based upon porous plate-printing, comprising sealing an electronic part with a resin by a primary porous plate-printing in vacuum, introducing the resin based on a pressure difference and effecting complementary sealing by a secondary porous plate-printing.

It is desired that the introduction of the resin based on the pressure difference and the secondary porous plate printing are effected in vacuum. However, the introduction of the resin based on the pressure difference may be effected in vacuum and the secondary porous plate-printing may be effected in the open air. Or, the introduction of the resin based on the pressure difference and the secondary porous plate-printing may be effected in the open air.

BRIEF DESCRIPTION OF THE DRAWINGS

An embodiment of the present invention will now be described in detail with reference to the accompanying drawings, wherein.

DESCRIPTION OF THE PREFERRED EMBODIMENTS

Figure 1:
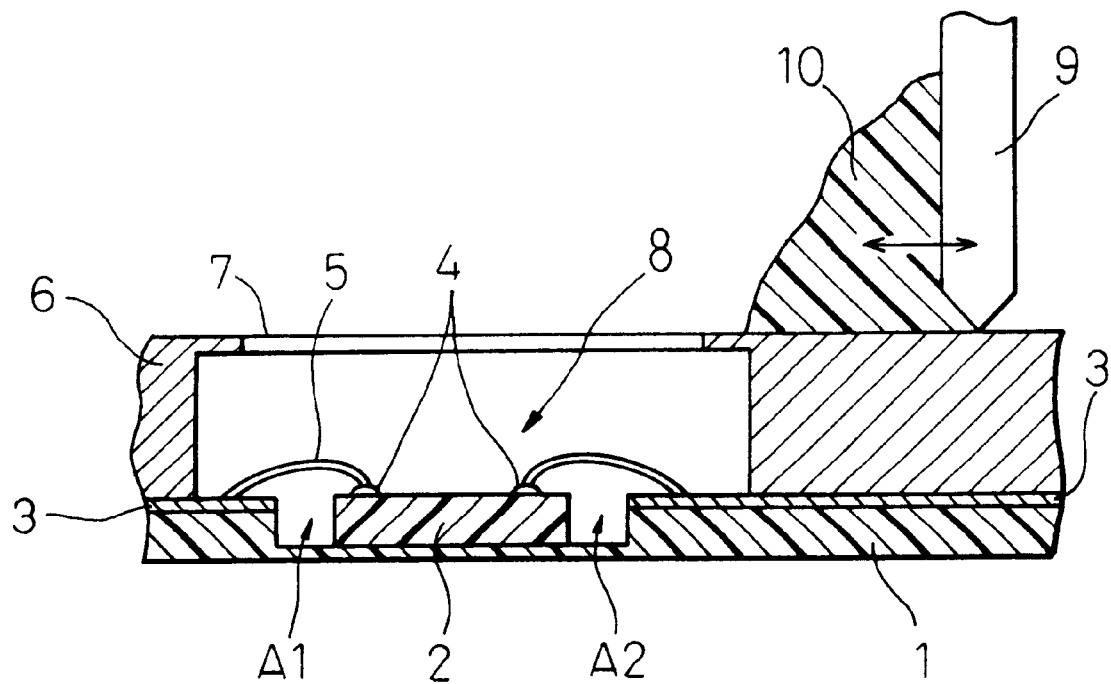
FIG. 1 is a vertical sectional view illustrating a state where an electronic part is sealed with a resin.

FIG. 1 illustrates a state where an electronic part 2 (CSP, COB, PLCC, BGA, TAB or the like) mounted on a substrate 1 is sealed with a resin. Wires 5 bonded to the leads 3 of the substrate 1 and to the bumps 4 of the electronic part 2 are arranged in a large number in parallel maintaining a very small pitch of the order of microns.

A porous plate 6 (screen mask) is arranged on the substrate 1. The porous plate 6 has pores 7 for pushing the resin in. The pores 7 are placed at a predetermined position with respect to a sealing portion 8. By moving the squeeze 9 (see arrow in FIG. 1), therefore, the sealing resin 10 fed onto the porous plate 6 can be pushed and introduced into the sealing portion 8.

The porous plate-printing (screen-printing) is effected in a vacuum chamber that is not shown. As a resin-sealing facility equipped with a vacuum chamber, there can be used the one disclosed in, for example, Japanese Examined Patent Publication (Kokoku) No. 6-66350. That is, the interior of the vacuum chamber is maintained in a vacuum degree of, for example, about 0.6 to 1.0 Torr. In this vacuum state, the squeeze 9 is moved from right to left. When moved by a predetermined stroke, the squeeze 9 is then moved from left to right. The squeeze 9 is thus reciprocally moved.

Owing to the primary porous plate-printing, the portions which cannot be directly and easily filled with the resin, such as the portions A1, A2 under the highly densely bonded wires 5, can be sealed with the resin 10 without permitting the air to remain (so that air-containing voids will not be formed).

After the sealing by the primary porous plate-printing in vacuum, the degree of vacuum in the vacuum chamber is further decreased (down to, for example, about 16 Torr). Therefore, a pressure difference of about 15 Torr develops between the interior and the exterior of the sealed portion 8, and whereby the interior of the sealing portion 8 is filled with the sealing resin 10, i.e., the portions A1, A2 are filled with the sealing resin 10 passing smoothly through very small gaps among the highly densely bonded wires 5 without causing damage to the wires 5. Therefore, the sealing resin infiltrates into every portion.

Thus, introduction of the resin is effected based upon the pressure difference following the sealing with the resin based on the primary porous plate-printing. Recessed portions (depressed portions) are formed in the surface of the sealing resin that is primarily porous plate-printed (see FIG. 4). This is because the unfilled portions formed during the primary porous plate-printing are now filled with the sealing resin 10 due to the pressure difference.

Following the introduction of the resin based on the pressure difference, the supplementary sealing is effected based on the secondary porous plate-printing in vacuum. In this case, the squeeze 9 is moved from the right to the left. Then, the recessed portions (depressed portions) are filled with the resin, and the surface is flattened.

During the secondary porous plate-printing, the squeeze 9 may, as required, be reciprocally moved. The degree of vacuum, in this case, is set to be equal to, or lower than, the degree of vacuum of during the introduction of the resin based on the pressure difference.

As required, furthermore, the sealing resin 10 may be supplied onto the porous plate 6 (screen mask) during the primary and secondary porous plate-printings. Moreover, the primary porous plate-printing, introduction of the resin based on the pressure difference and secondary porous plate-printing may be effected by using the same vacuum chamber. The invention, however, is in no way limited thereto only.

That is, a vacuum chamber for effecting the primary porous plate-printing may be installed contiguous to another vacuum chamber for effecting the secondary porous plate-printing. After the primary porous plate-printing is effected in the vacuum chamber for effecting the primary porous plate-printing, the degree of vacuum is lowered to introduce the resin based on the pressure difference. Then, after the resin is introduced based on the pressure difference, the substrate is transferred into the other vacuum chamber and in which the secondary porous plate-printing is effected.

Furthermore, the substrate 1 after it is subjected to the primary porous plate-printing in the vacuum chamber for effecting the primary porous plate-printing, may be transferred into the other vacuum chamber to introduce the resin based on the pressure difference. Thereafter, the degree of vacuum is maintained or is lowered to effect the secondary porous plate-printing. Thus, the invention can be carried out according to various embodiments so long as the primary porous plate-printing, introduction of the resin based on the pressure difference and secondary porous plate-printing are executed in vacuum. In this case, during the introduction of the resin based on the pressure difference, the degree of vacuum is maintained, depending upon the form of electronic parts and the kind of the sealing resin, to be lower than the degree of vacuum during the primary porous plate-printing. In general, it is desired that the degree of vacuum is maintained to be lower by more than 10 times than that of the former case. Besides, the time for introducing the resin based on the pressure difference can be suitably set depending upon the form of the electronic part and the kind of the sealing resin.

Therefore, even those portions that cannot be easily filled with the sealing resin 10, such as the portions (A1, A2 in FIG. 1) under the densely bonded wires 5, can be filled with the sealing resin to a sufficient degree without forming air-containing voids. Besides, such portions can be filled with the resin without causing damage to the wires 5. Accordingly, the sealing with the resin is effected maintaining flat surfaces, sufficiently high dimensional precision and greatly improved reliability.

Figure 2:
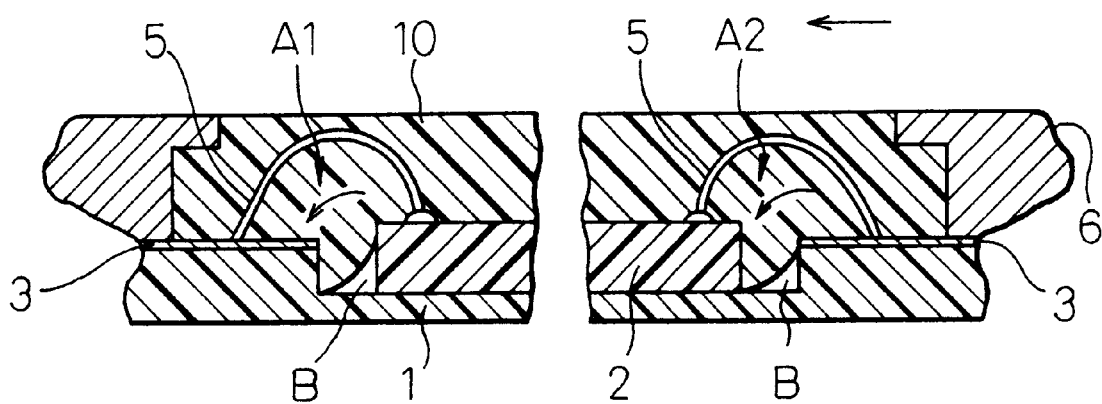
FIG. 2 is a diagram illustrating, on an enlarged scale, the state when a squeeze is shifted from the right side toward the left side in vacuum.

FIGS. 2 to 5 illustrate, in an exaggerated manner, the portions A1, A2 to be filled with the sealing resin 10 under the wires 5. FIG. 2 illustrates a state where the squeeze 9 is moved from the right to the left as indicated by an arrow in vacuum of 0.6 to 1.0 Torr. In this state, the portion B has not been filled with the sealing resin 10. However, no air exists in the portion B.

Figure 3:
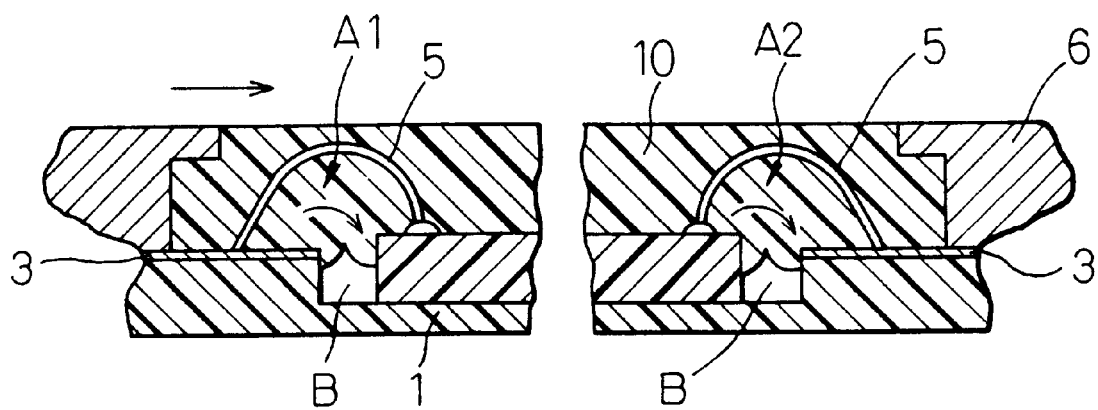
FIG. 3 is a diagram illustrating, on an enlarged scale, the state when the squeeze is reciprocally moved (primary porous plate-printing) in vacuum.

FIG. 3 illustrates a state where the resin is introduced by the primary porous plate-printing by reciprocally moving the squeeze 9 in vacuum of 0.6 to 1.0 Torr. In this state, too, the portion B has not been filled with the sealing resin 10.

Figure 4:
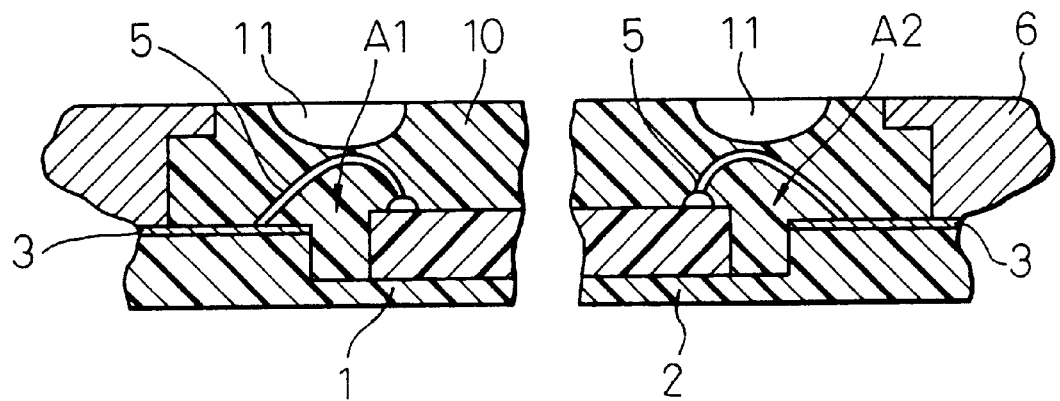
FIG. 4 is a diagram illustrating, on an enlarged scale, the state when the introduction is effected based on a vacuum pressure difference after the primary porous plate-printing in vacuum.

FIG. 4 illustrates a state where the resin is introduced based on the pressure difference by changing the degree of vacuum from 0.6–1.0 Torr to 16 Torr. In this state, the sealing resin 10 infiltrates into every portion, and there exists no unfilled portion. However, a recessed portion (depressed portion) 11 is formed in the surface of the sealing resin 10. The recessed portion (depressed portion) 11 is formed as the portion B that had not been filled with the sealing resin is now filled with the sealing resin 10.

Figure 5:
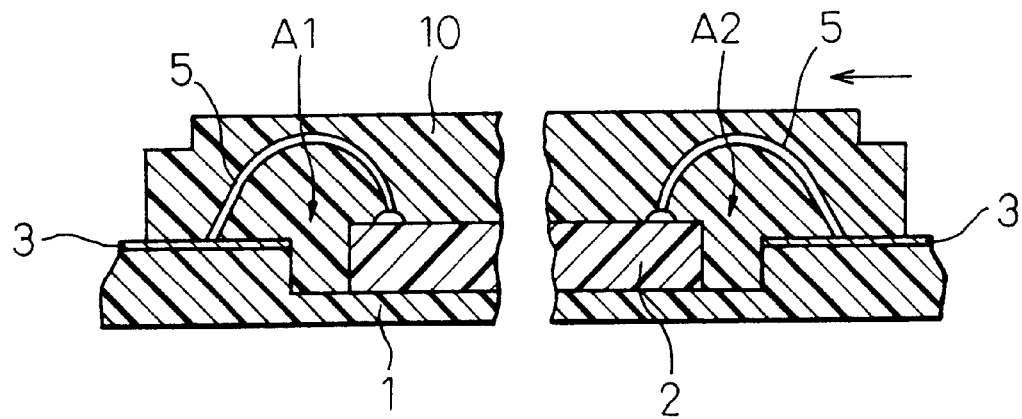
FIG. 5 is a diagram illustrating, on an enlarged scale, the state of being sealed with the resin after a secondary porous plate-printing in vacuum.

FIG. 5 illustrates a state where the secondary porous plate-printing is effected by moving the squeeze 9 from the right to the left as indicated by an arrow in vacuum of 16 Torr. In this state, the recessed portion (depressed portion) 11 has been supplemented with the sealing resin 10 and the surface is flat.

After the electronic part is sealed with the resin by the primary porous plate-printing in a vacuum as described above, the resin is introduced in a vacuum and, then, supplementary sealing with the resin is effected by the secondary porous plate-printing in a vacuum. The invention, however, encompasses any other embodiment so far as the sealing with the resin is effected by the primary porous plate-printing in a vacuum, the resin is introduced based on the pressure difference, and the supplementary sealing with the resin is effected by the secondary porous plate-printing.

That is, the sealing may be effected by the primary porous plate-printing in a vacuum, the resin may be introduced based on the pressure difference in a vacuum and, then, the supplementary sealing may be effected by the secondary porous plate-printing at atmospheric pressure. Moreover, the sealing may be effected by the primary porous plate-printing in a vacuum and, then, the resin may be introduced based on the pressure difference at atmospheric pressure and the supplementary sealing may be effected by the secondary porous plate-printing under atmospheric pressure. It is, however, most desired to effect the primary porous plate-printing, to introduce the resin based on the pressure difference and to effect the secondary porous plate-printing all in a vacuum.

The time for introducing the sealing resin based on the pressure difference under atmospheric pressure can be suitably set depending upon the form of electronic part and the kind of the sealing resin. It is further allowable to introduce the the sealing resin based on the pressure difference and to effect the secondary porous plate-printing under atmospheric pressure by using the vacuum chamber for effecting the primary porous plate-printing.

As described above, the present invention is concerned with sealing electronic parts mounted on the substrates with a resin and accordingly, even those portions that cannot be easily filled with the sealing resin containing a large amount of filler and having a high viscosity, such as the portions under the highly densely bonded wires, can be filled with the sealing resin to a sufficient degree without forming air-containing voids. Besides, such portions can be filled without causing damage to the wires. The sealing with the resin is effected maintaining flat surfaces of the sealing resin, sufficiently high dimensional precision and greatly improved reliability. Accordingly, the invention can be applied more generally such as up to the transfer molding.

Although the present invention has been fully described in connection with the preferred embodiments thereof with reference to the accompanying drawings, it should be noted that various changes and modifications will be apparent to those skilled in the art. Such changes and modifications are to be understood to be included within the scope of the present invention as defined by the appended claim unless they depart therefrom.

What is claimed is:

1. A method of sealing electronic parts mounted on substrates with a resin using porous plate-printing, comprising sealing an electronic part with a resin by a primary porous plate-printing in vacuum to produce a sealed part having an interior, applying a pressure difference in a vacuum to the sealed part for effecting introduction of the resin into the interior of the sealed part, and providing a complementary sealing on a printed portion of the sealed part by a secondary porous plate-printing.

2. A method of sealing electronic parts mounted on substrates with a resin according to claim 1, wherein the secondary porous plate-printing is effected at atmospheric pressure.

* * * * *